United States Patent [19]

Chan et al.

[11] Patent Number: 5,508,665
[45] Date of Patent: Apr. 16, 1996

[54] OSCILLATOR OPERABLE IN A HIGH IMPEDANCE MODE

[75] Inventors: Yiu K. Chan, Surrey; Krista Tindorf, Port Moody, both of Canada

[73] Assignee: Motorola, Inc., Schaumburg, Ill.

[21] Appl. No.: 331,456

[22] Filed: Oct. 31, 1994

[51] Int. Cl.$^6$ .................................................. H03B 5/18
[52] U.S. Cl. ................... 331/117 D; 331/36 C; 331/101; 331/177 V
[58] Field of Search .......................... 331/36 C, 96, 331/99–102, 117 R, 117 FE, 117 D, 116 R, 116 FE, 107 DP, 107 SL, 107 C, 177 V

[56] References Cited

U.S. PATENT DOCUMENTS 5,185,583   2/1993   Ooi et al. .................... 331/177 V X

OTHER PUBLICATIONS

Vendelin, George E., et al. Microwave Circuit Design Linear and Nonlinear Techniques, Published in 1990 by John W. Wiley & Sons, New York, pp. 408–413.

Trans–Tech Sales Brochure, "The Ceramic Solution", Coaxial Transmission Line Elements For Use In RF Amplifier Oscillator Tank Circuits, p. 3. (no date).

Primary Examiner—David Mis
Attorney, Agent, or Firm—Charles W. Bethards; Kevin A. Buford

[57] ABSTRACT

An oscillator arranged to operate at an oscillation frequency includes a resonant structure 137, preferably a coaxial resonator, selected to resonate at a frequency, and an impedance 210, preferably a transistor 101 based common collector circuit, parallel coupled to said resonant structure 137, having a negative real part with a real magnitude and an imaginary part with an imaginary magnitude, said real magnitude being a function of said imaginary magnitude, said imaginary magnitude selected such that said real magnitude falls within 50% of a maximum at the oscillation frequency.

15 Claims, 3 Drawing Sheets

OSCILLATOR OPERABLE IN A HIGH IMPEDANCE MODE

FIELD OF THE INVENTION

This disclosure deals with an oscillator and more specifically but not limited to such an oscillator operable in a high impedance mode.

BACKGROUND OF THE INVENTION

Generally oscillators are known. A general model for transistor based oscillators has been described. This model includes a three terminal transistor with a generalized impedance connected between each terminal. This model purports to describe all popular oscillator configurations when one at a time each terminal of the transistor is individually grounded. That and numerous texts concerning the topic notwithstanding, practitioners continue to devote an extensive amount of effort to improving and creating oscillators that serve their particular purposes.

The operative word for all such efforts is compromise. The practitioner is continually asked to make tradeoffs between oscillator power, power consumption, noise performance, frequency stability, tuning range, interference susceptibility, physical space, and economic considerations. Most such efforts now utilize some form of transistor based active circuit. Transistors contribute their own set of problems for the oscillator practitioner due to there inherent non-linearities, noise properties, and temperature variations.

One oscillator presently used is a transistor based common collector configuration known as a Colpitts oscillator. This arrangement often includes from an alternating current (ac) perspective a resonator or simple inductor and parallel coupled thereto a circuit including an npn transistor with the base coupled to the resonator or inductor, a base emitter connected capacitor, and a capacitor series connected from the emitter to the resonator or inductor. Texts and practitioners counsel operation of the transistor with a relatively low magnitude reactance or large value capacitor across the base emitter in an attempt to overcome temperature variations and non-linearities of the transistor.

Unfortunately, at UHF of higher frequency, when the inductor is replaced with a high impedance resonator, this results in a relatively lower loaded Q factor (Q) and thus lower signal to sideband noise ratio for the oscillator which is a particular disadvantage for oscillators used as a reference source or as a voltage tuned oscillator. To compensate, the unloaded Q for the resonator or inductor must be increased at a net and often substantial increase in the size or cost of that component and the resultant oscillator circuit. Clearly a need exists for a small relatively high performance oscillator that may be advantageously employed as a voltage variable oscillator

BRIEF DESCRIPTION OF THE DRAWINGS

The features of the present invention which are believed to be novel are set forth with particularity in the appended claims. However, the invention together with further advantages thereof, may best be understood by reference to the accompanying drawings wherein:

DETAILED DESCRIPTION OF A PREFERRED EMBODIMENT

Generally the instant disclosure concerns oscillators and more specifically a novel oscillator that offers improved performance at a reduced physical size. As an overview the oscillator in an exemplary form may be viewed as a resonator based Colpitts oscillator where a transistor based active load on the resonator is operating in a voltage or high impedance mode rather than a current or low impedance mode.

One preferred embodiment is an oscillator including a resonant structure selected to resonate at a frequency, and an impedance parallel coupled to the resonant structure. The impedance further has a negative real part with a real magnitude and an imaginary part with an imaginary magnitude where the real magnitude is a function of the imaginary magnitude and the imaginary magnitude has been selected such that the real magnitude falls within 50% of a maximum at the frequency. The resonant structure is, preferably, a resonator such as a coaxial resonator.

A further preferred embodiment is an oscillator including a resonant structure having a characteristic impedance and an impedance that includes a transistor base terminal. This impedance is AC connected to the resonant structure at the transistor base terminal and has an imaginary part with an imaginary magnitude that is selected to exceed the characteristic impedance at an operating frequency.

Still another preferred embodiment is a voltage tuned oscillator arranged to operate at an oscillation frequency including a resonator open at a first end, shorted at a second end, and having a characteristic impedance, a transistor having a base terminal, an emitter terminal, and a collector terminal, where the base terminal is ac connected to the first end of the resonator so as to load the resonator with an impedance having a first capacitive reactance, the emitter terminal is series coupled through a second capacitive reactance to the second end of the resonator, the second capacitive reactance is selected such that the first capacitive reactance exceeds the characteristic impedance, and the collector terminal is coupled to a load, and further a voltage variable reactance that is coupled to the resonator.

Figure 1:
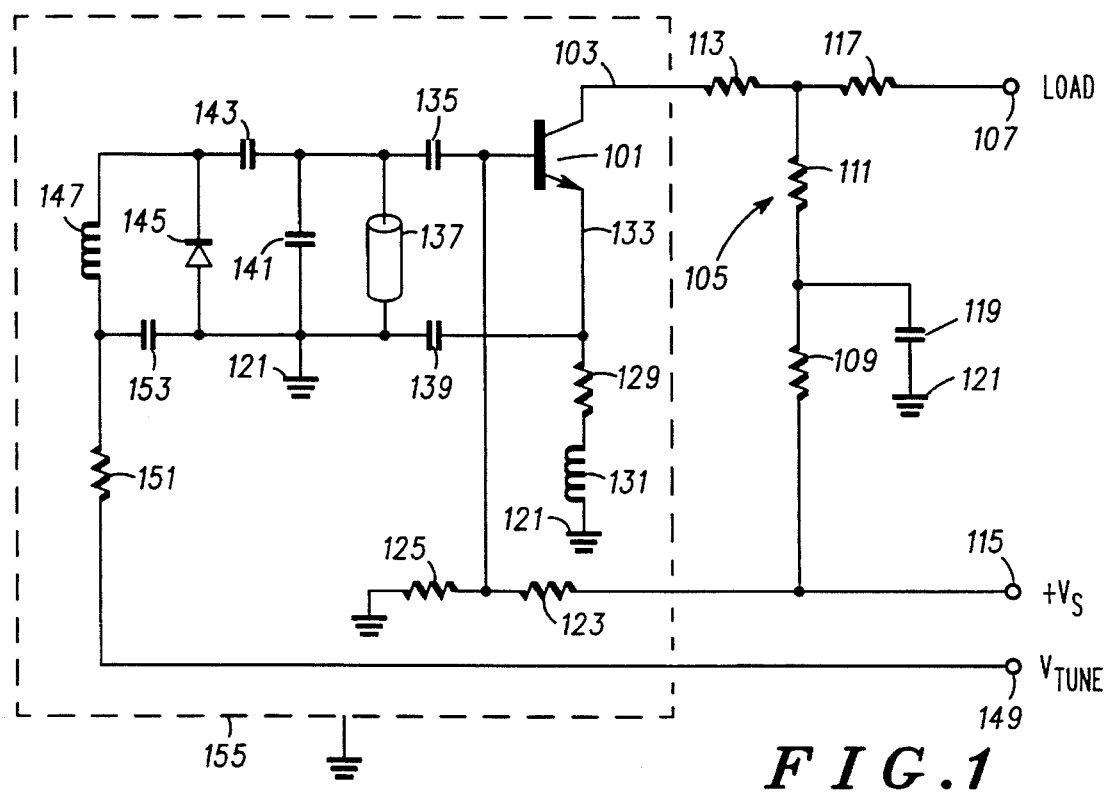
FIG. 1 is a schematic diagram of an oscillator in accordance with the instant invention.

The invention may be further explained and appreciated by reference to the following description in conjunction with the Figures wherein FIG. 1 is a schematic diagram of an oscillator in accordance with the instant invention. FIG. 1 depicts a transistor 101, such as a BFQ67W available from Phillips or the like that has a collector terminal 103 coupled to a resistive biasing circuit 105 and suitable for coupling to a load (not specifically shown) at output 107.

The resistive biasing circuit 105 includes resistors 109, 111, 113 series coupled to a power supply voltage Vs 115. A further resistor 117 is connected from the junction between resistors 111 and 113 to the output 107. From the junction between resistors 109 and 111 a capacitor 119 is connected to a ground potential 121 and acts to help filter or remove the alternating current (ac) generated by the oscillator from Vs 115.

The particular values selected for resistors 109, 111, 113, 117 and capacitor 119 are generally determined by the desired bias current for the transistor 101 as well as expected load impedances all as well understood in the art. Here the values for the resistors 109, 111, 113, 117 are respectively and preferably 16, 27, 30 and 30 ohms and the capacitor 119 is a 0.01 micro farad (mmf) capacitor.

The balance of the biasing arrangement for the transistor 101 includes resistors 123, 125 forming a high value resistor divider, here 27K ohms in parallel with the same, that is coupled to a base terminal 127 of the transistor 101 and a series combination of resistor 129 and inductor 131 coupled from an emitter terminal 133 to the ground potential 121. The resistor 129 essentially establishes the collector current for transistor 101 at approximately the base terminal voltage, here approximately ½ of Vs 115, less 0.7 volts divided by the value selected for resistor 129, here 390 ohms. The inductor 131 is selected to be a high impedance at the operating frequency, here nominally 815 MHz, of the oscillator and more particularly, preferably, 220 nano henrys with a parallel resonant frequency approaching the nominal operating frequency.

Generally the balance of the FIG. 1 oscillator may be ignored from a DC biasing perspective as it determines and effects only the ac characteristics of the oscillator. Similarly the biasing components so far discussed may be ignored with respect to the ac characteristics unless otherwise indicated above or herein below. Regarding the balance of the schematic, capacitor 135 is coupled from the base terminal 127 to a first end of a resonant structure, preferably, a resonator, such as a coaxial resonator 137 with the first end open.

The resonant structure or resonator or coaxial resonator is selected to have a parallel resonant frequency that is above the desired or nominal operating frequency of the oscillator. In the preferred embodiment this resonant frequency is chosen to approximate 1000 MHz or approximately 125% of the nominal oscillator operating frequency or more particularly the coaxial resonator has been selected to be ¼ wavelength long at 1000 MHz. The coaxial resonator further has a characteristic impedance of, preferably, 8 ohms.

The capacitor 135 is selected to provide a relatively low ac impedance between the resonant structure and the base terminal 127 such that the base terminal may be said to be ac connected to the resonant structure. In the preferred embodiment capacitor 135 is a 68 pico farad capacitor having a series resonant frequency approaching the nominal operating frequency of the oscillator.

The emitter terminal 133 is coupled by a capacitor 139 to a second, preferably, shorted end of the resonant structure or coaxial resonator 137. The capacitor 139 has been carefully selected to have a value of, preferably, 2.2 pico farad but more importantly so as to present a particular impedance or portion thereof to the resonant structure all as will be discussed in further detail below.

A capacitor 141 is parallel coupled to the coaxial resonator 137 and provides a means for fine tuning the nominal oscillation frequency of the oscillator. In the preferred embodiment this capacitor is not used and has been replaced by an open circuit. Additionally, in the further preferred embodiment representing a voltage tuned oscillator there is, parallel coupled to the resonator or resonant structure, a series combination of capacitor 143 and varactor 145. The junction between varactor 145 and capacitor 143 is driven through an inductor 147 by a tuning voltage, preferably supplied by the loop filter of a phase locked loop, at input 149 as filtered by a resistor 151 and capacitor 153. In this embodiment an increasing tuning voltage across the varactor 145 decreases the capacitance of the varactor resulting in the oscillator frequency of the oscillator increasing.

Figure 2:
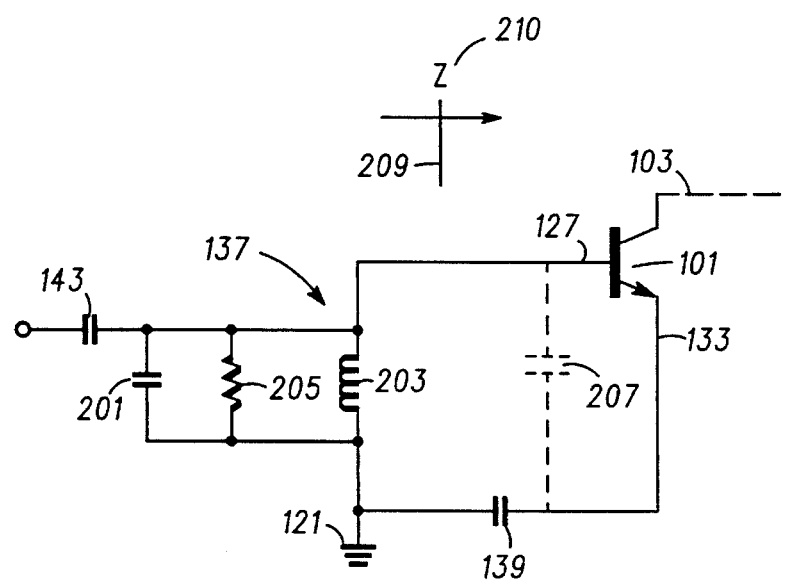
FIG. 2 is a schematic diagram of an ac equivalent model of the FIG. 1 oscillator.

Referring additionally to the FIG. 2 schematic diagram of the ac equivalent circuit of FIG. 1, wherein like reference numerals refer to like elements, a more detailed description of the ac performance and characteristics of the preferred embodiment will be undertaken. Generally FIG. 2 depicts the ac model of the oscillator of FIG. 1 where the resonant structure or resonator, preferably, a coaxial resonator 137 that has been selected to resonate at a frequency has been replaced by an equivalent parallel connected circuit, having a like reference number 137 and including a resistor, inductor, and capacitor 205, 203, 201. The resonant structure or coaxial resonator 137 will have a characteristic impedance (Zo) such as 4 or 8 ohms and in the preferred embodiment is a shorted coaxial resonator having a first end, open end, ac connected to the base terminal 127 and a second or shorted end coupled to the ground or reference potential 121.

The values for the inductor 203 or capacitor 201 are such that their reactance at the self resonant frequency is equivalent to the characteristic impedance of the resonator. The value of resistor 205 (Rp) will depend on the quality factor (Q) of the resonator with higher Q devices having higher value resistors in approximate accordance with Rp=Q×Zo= 180×8=14400 ohms preferably. Further characteristics of the resonant structure or resonator or shorted coaxial resonator of the preferred embodiment that uses coaxial resonator supplied by UBE Electronics, LTD include:

Zo=characteristic or line impedance=7 to 8 ohms (applied to our resonators),

Er=dielectric constant of insulation material between inner and outer conductor of coaxial line.

OD=inside diameter of the outer conductor=2.09 millimeters.

ID=diameter of the inner conductor=0.76 millimeters.

f=any frequency, Hz fo=self resonance frequency of the 'shorted coaxial line'= 1000 Mhz X=reactance at frequency, f pi=180 degree K=1.178, constant for square crossectioned coax-line.

Rp=equivalent parallel loss resistance near fo.

$Zo = 138/(Er)^{0.5} * \log(OD * K/ID)$.

$X = jZo * \tan(pi/2 * f/fo)$

Rp=Q * Zo side band noise to carrier signal ratio:

L=Side Band Noise to Signal Ratio fm=point at frequency axis relative to f where noise reading is taken f=operating frequency.

$Q_L$=loaded Q of resonator.

F=active device noise factor.

k=boltzman constant=1.38*10e-23.

T=degree in Kelvin.

B=−3 dB bandwidth used for noise measurement.

$P_{avs}$=available power coupled to the input of the active network.

fc=intercept point of white noise and 1/f noise of active device.

$$L(fm) = \frac{FKTB}{2Pavs} \cdot \left\langle \left( \frac{1}{fm^3} \cdot \frac{fc*f^2}{4Q_L^2} \right) + \left( \frac{1}{fm^2} \cdot \frac{f^2}{4Q_L^2} \right) + \left( \frac{fc}{fm} \right) + \frac{1}{1} \right\rangle$$

Given fm, fc, FKTB and Pavs, the noise power L at location or frequency f+fm can be reduced by increasing the quality factor of the loaded Q ($Q_L$).

Additionally depicted is an impedance 210 shown looking to the right hand side of line 209 that is parallel coupled to the resonant structure or the equivalent parallel connected circuit of the resonant structure. The impedance 210 has a negative real part with a real magnitude and an imaginary part with an imaginary magnitude. The real magnitude is a function of the imaginary magnitude. In a preferred embodiment in accordance with the instant invention the imaginary magnitude is selected generally by selecting values of optional base emitter coupled capacitor 207 and capacitor 139, or preferably by selecting an appropriate value for capacitor 139, such that the real magnitude falls within 50% of a maximum at the oscillation frequency of the oscillator.

In somewhat more detail and alternatively the impedance 210 includes a base terminal 127 ac connected to the resonant structure or coaxial resonator 137. AC connected for purposes of this discussion refers to a near AC short circuit across the capacitor 135 (thus it has been removed from the model) or more generally an impedance at the relevant or operating frequencies that is less than 20% or preferably 5% of the value of the impedances seen looking into the base terminal 137. In this alternative view of impedance 210 the magnitude of the imaginary part of the impedance 210 is selected, generally by adjusting the values of a optional base emitter coupled capacitor 207 and capacitor 139, or preferably by adjusting or selecting the value of capacitor 139, to exceed the characteristic impedance of the resonator at the operating frequency.

In still a further embodiment or in more detail the impedance 210 may be described as the transistor 101 having the base terminal 127, the emitter terminal 133, and the collector terminal 103, with the base terminal ac connected to the first end of the resonator, preferably, coaxial resonator 137 so as to load the resonator with the impedance 210 that has a first capacitive reactance. The emitter terminal 133 is series coupled through a second capacitive reactance, specifically the capacitor 139, to the second or shorted end of the resonator or coaxial resonator 137 and the second capacitive reactance is selected such that the first capacitive reactance exceeds the characteristic impedance.

This embodiment may be particularly suited for a voltage tuned oscillator where the collector terminal 103 is coupled to a load, in accordance with the above discussions referencing FIG. 1, and a voltage variable reactance, such as preferably varactor 145, is coupled to the first or open end of the coaxial resonator 137 through capacitor 143.

To achieve the various above specified relationships between the real magnitude of the impedance 210 and a maximum value for this real magnitude or alternatively the imaginary magnitude of the impedance 210 as compared to the characteristic impedance of the resonator 137 generally by selecting the values of optional capacitor 207 and capacitor 139 or preferably by selecting the value of the capacitor 139 a brief theoretical review is necessary.

Historically for a loss less model the impedance 210 when a capacitor 207 is connected from the base to the emitter terminal has been approximated by:

Z210=R−jX where;

the real part R=−gm*(Xc207*Xc139), where gm is the small signal gain of transistor 101, Xc207 is the reactance of capacitor 207, and Xc139 is the reactance of capacitor 139; and the imaginary part X=Xc207+Xc139.

Traditionally for a Colpitts oscillator, practitioners and text books suggest, in order to maintain a stable well behaved oscillator circuit, that the hie (small signal base emitter resistance) of the transistor 101 representing circuit loss, should be swamped out by the reactance of optional capacitor 207.

Therefore, Xc207<< hie, where hie is the small signal resistance of the base emitter junction and for similar reasons, Xc139<< 1/hoe, where hoe is the small signal resistance of the collector emitter junction of transistor 101.

Under these circumstances according to the art, the Q (Q=Q,parallel=Rp/X) across the base emitter junction of transistor 101 is the ratio of Rp=hie of the device to the X=Xc207 of the optional capacitor 207, or Q=hie/Xc207 or a relatively high Q if Capacitor 207 is relatively large hence Xc207 is relatively small. Under these circumstances most of the current from the inductor in a classic Colpitts oscillator, will flow through optional capacitor 207 and thus allegedly avoid over saturation of the transistor input as well as save resonator energy. Given these conditions and an inductor based colpitts oscillator, where the-R (real part) of the impedance is operating in series with the resonating current, practitioners have accepted that the -R must be kept low to maintain high Q or risk excessive transistor over drive loss. That said, the -R had a lower boundary and that boundary was established as a value that assured -R was large enough to over come or cancel other passive component losses and device drive losses thus insuring oscillation. This boundary is captured by the exemplary equation stating that 1/Xc> the square root of (Rs/gm) if Xc207=Xc139=Xc and where Rs is the series equivalent resistance of a impedance looking to the left hand side of line 209 (hereafter R 209).

The reader is reminded that the above conditions and descriptions are applicable to a Colpitts Oscillator where the dominating reactance of the 'impedance' is one of the two lumped elements that govern the oscillator operating frequency and the other element is a lumped inductor. In the instant invention this is not the case and the text book based Colpitts oscillator approach no longer leads to a high operating and high loaded Q oscillator. In this case, where a stand alone resonator 137 or shorted coaxial line supports or carries the majority of the resonating current in a parallel resonant mode of operation rather than the resonating current largely passing through the impedance 210 as in a series resonant mode a surprising improvement in oscillator signal to side band noise ratio may be obtained by terminating the resonator with a high impedance. This high impedance must support a relatively large voltage swing rather than a large current swing as is the case with the text book based approaches.

In the preferred embodiment shorted nearly ¼ wave coaxial line 137 is used to store energy. This line or resonator will have a current node at the shorted end at potential 121 and a voltage node at the open end. The open end is sometimes called the anti-resonance due to its extremely high terminal resistance that resists injection current at the self resonance frequency. The unloaded Q for the coaxial resonator as noted above is evaluated by the effective parallel resistance, Rp=14400 ohms, compared with the characteristic impedance Zo=7–8 ohms of the line or the unloaded Q is approximately 180. Any additional effective parallel resistance such as that contributed by impedance 210 can reduce the Rp and the operating or effective or loaded Q directly. Therefore for this kind of resonator 137 to serve as the basis of a high Q oscillator, it need to be directly connected to an active network with a high impedance such as impedance 210 that will draw the least amount of current possible from the resonator.

Describing this mathematically and starting with the same equations above, Z210=R–jX, where R=–gm*Xc207*Xc139, and X=Xc207+Xc139 in a lossless model. To make Z210 large R, X, or both, must be increased. When the loss factors represented by hie and hoe are added in;

Xc207 become Xc207 in parallel with hie

Xc139 become Xc139 in parallel with hoe Let Ri+Xs1 be a series equivalent of Xc207 in parallel with hie and Ro+Xs2 be a series equivalent of Xc139 in parallel with hoe. These may be calculated using the known parallel to serial transformation, where s denotes series and p denotes parallel;

Rs=Rp/(1+$Q^2$) and Xs=Rs×Q where Rs=series R and Q=Rp/Xp where Rp=parallel R

Substituting for Rp, Xp, respectively, hie, Xc207 or hoe, Xc139 we may obtain

Ri=hie/(1+$Q1^2$)
Ro=hoe/(1+$Q2^2$)
Xs1=Ri×Q1
Xs2=Ro×Q2 where
Q1=hie/Xc207, and
Q2=hoe/Xc139

From the above expressions, where $Q1^2$ and $Q2^2$ are each significantly greater than 1, Ri is proportional to $Xc207^2$ and Ro is proportional to $Xc139^2$.

From this for the model with loss
Z210=Zt=Rt+jXt, with
Rt=R+(Ri+Ro), and
Xt=Xs1+Xs2, or
Z210=Zt=R+(Ri+Ro)–j(Xs1+Xs2)

For R=–gm x Xc207 x Xc139, then R is proportional to Xc207 and Xc139. But Ri and Ro are proportional to the square of Xc207 and Xc139, respectively.

Figure 5:
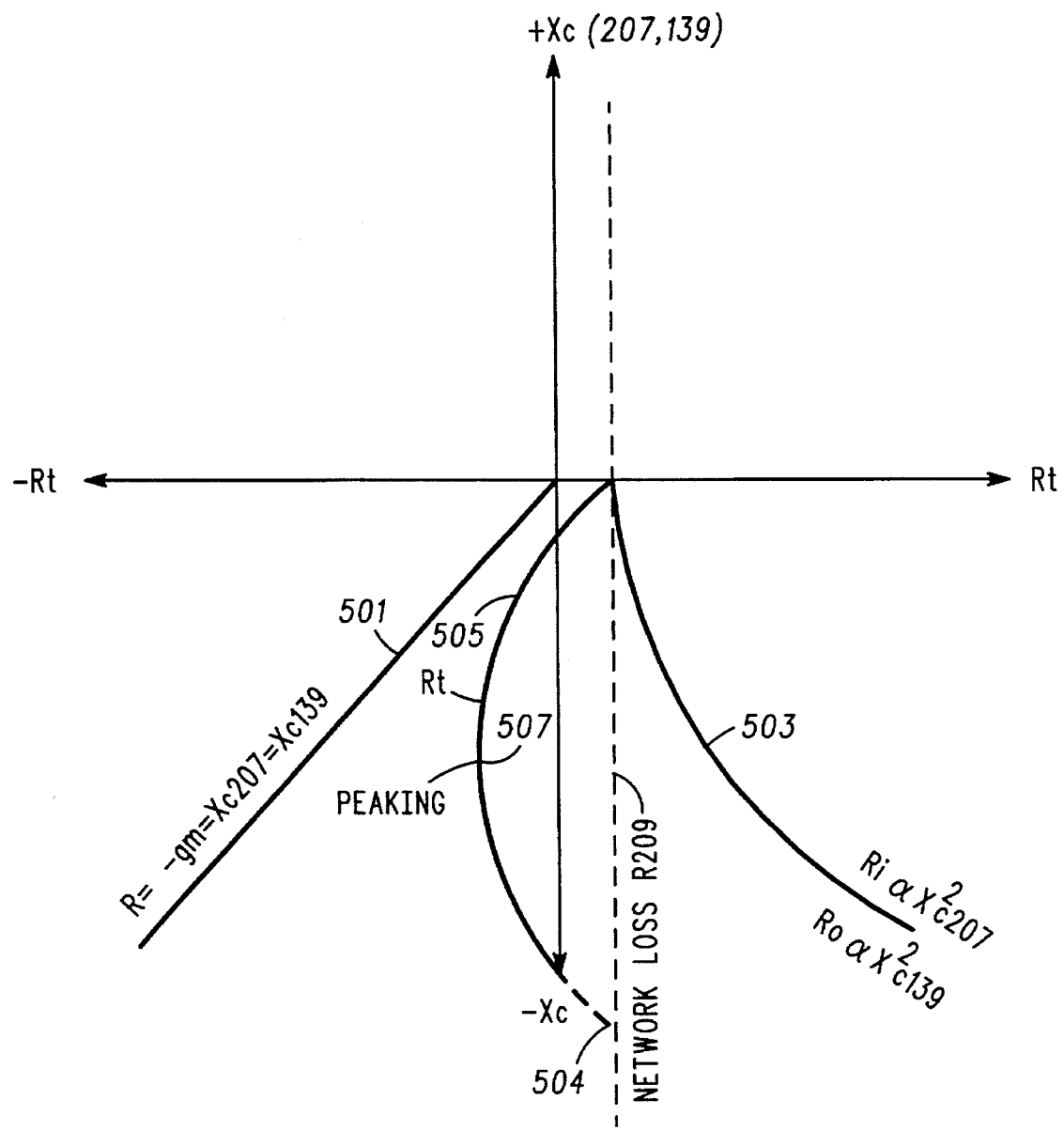
FIG. 5 is a graphical representation of the theoretical real and imaginary components of an impedance of the FIG. 1 circuit.

Thus, initially, when Xc207 and Xc139 are increasing from 0, R increases in a negative direction asymptotic to line 501 in FIG. 5. Similarly, Ri and Ro increase in a positive direction asymptotic to line 503 for large Xc207 and Xc139. Therefore the resulting Rt shows a net increase in a negative direction as Xc207 and Xc139 increase with a resulting peak where the rate of change of R matches the rate of change of Ri and Ro as depicted by line 505 at point 507. As Xc207 and Xc139 continue to increase, Rt will decrease, and when Rt is equal to the (equivalent series) loss resistance of the resonator and all other elements of the circuit to left hand side of line 209, hereafter R209, oscillation will no longer occur this is depicted in FIG. 5 at location 509.

The above discussion showing that the real or imaginary part of the impedance Z210 may be adjusted or maximized by varying the values of a capacitive reactance, specifically the capacitor 139 or optional capacitor 207 has been provided for a conceptual understanding. Additional corroborative information has been developed using a more elaborate computer based linear network simulation environment and an S-parameter analyzer. This S-parameter model uses the parameters provided by manufacturers for all components including the S-parameters for transistor 101. A one port model network for impedance 210 was constructed. The results, including the peaking effect on Rt and Xt is extracted and is presented for two different circumstances in FIG. 3 and 4.

Figure 3:
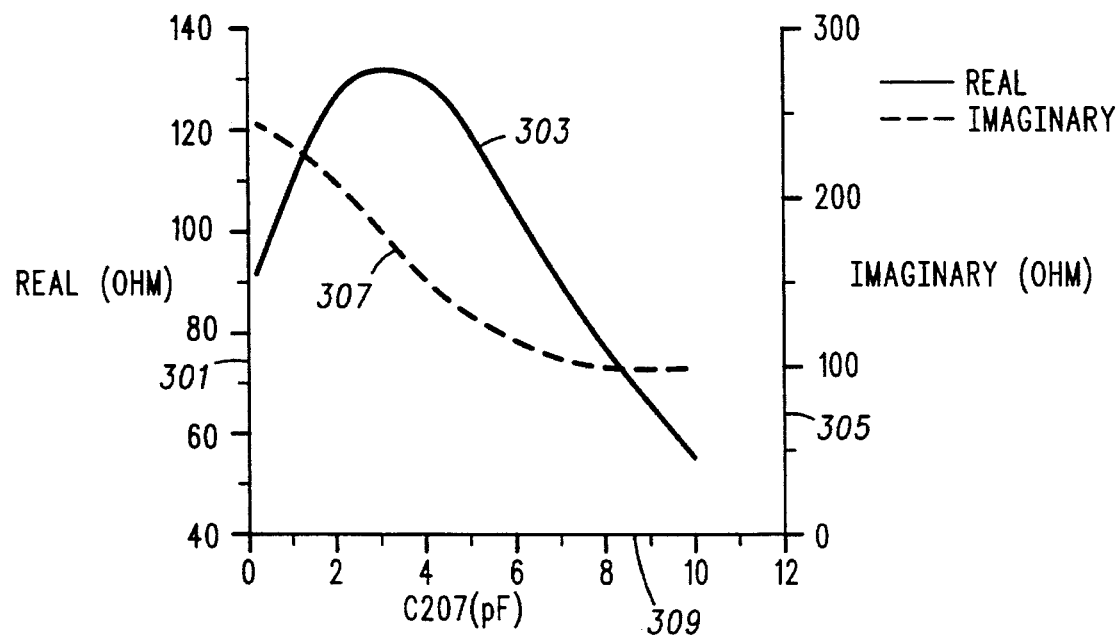
FIG. 3 is a first graphical representation of real and imaginary components of an impedance of the FIG. 1 circuit as modeled as a function of component values used in that circuit.
Figure 4:
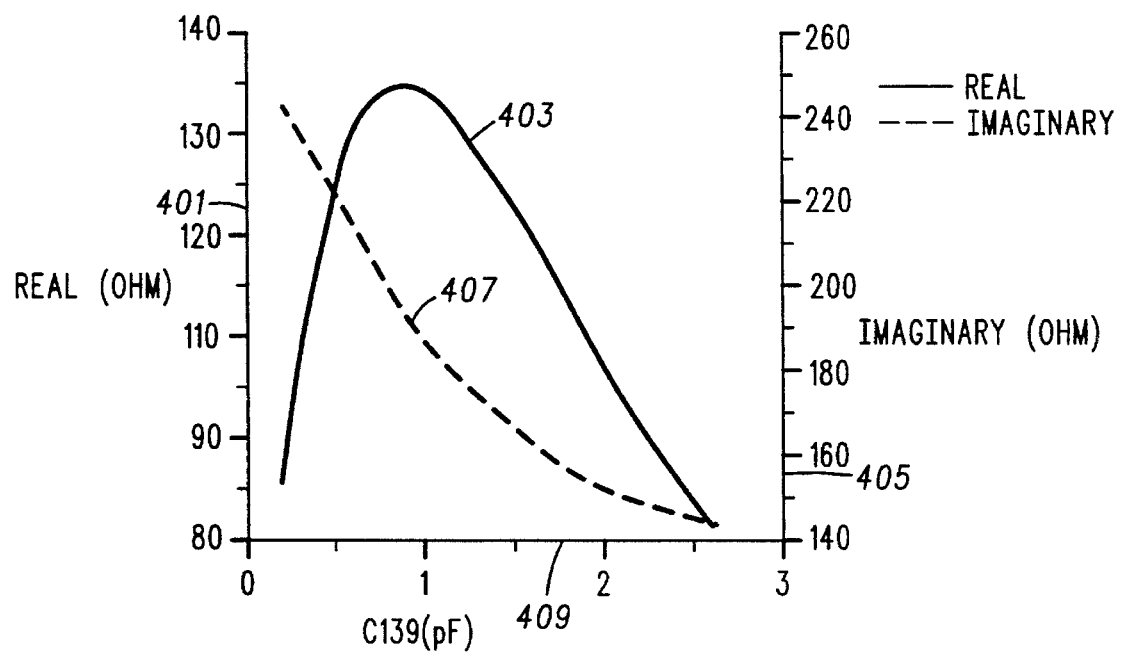
FIG. 4 is a second graphical representation of real and imaginary components of an impedance of the FIG. 1 circuit as modeled as a function of component values used in that circuit.

FIG. 3 shows, based on the S-parameter model, read along the left hand axis 301 the real part 303 and read along the right hand axis 305 the imaginary part 307 of impedance 210 with capacitor 139 held constant at 3.2 pico farad as a function of optional capacitor 207 read along the horizontal axis 309. FIG. 4 shows, based on the S-parameter model, read along the left hand axis 401 the real part 403 and read along the right hand axis 405 the imaginary part 407 of impedance 210 with optional capacitor 207 held constant at 1.0 pico farad as a function of capacitor 139 read along the horizontal axis 409. In both cases it is clear that the real part may be more or less arbitrarily adjusted including adjusting for a peak or maximum value and that the imaginary part may be adjusted over a broad range.

Again the S-parameter model is a linear simulation leaving the nonlinear effects unpredicted, if not unpredictable. Thus as a last step the oscillator was constructed and further optimized for best noise and gain margin under laboratory conditions yielding the final circuit as depicted in FIG. 1 and above described. One effect of the nonlinear contributions appears to be an increase in the base emitter capacitance of the transistor 101. Thus in the final circuit it has been experimentally determined that optional capacitor 207 may be eliminated altogether and that capacitor 139 should be 2.2 pico farad for an oscillator operating at 815 MHz. These laboratory experiments using an actual circuit with a shorted coaxial resonator with a Q of 180 have yielded a signal to side band noise ratio of 10–20 dB better than that realized using the same coaxial resonator and conventional text book oriented design techniques.

Resistor 151, preferably 4.7 Kohm, pass on the DC bias voltage Vtune 149 through inductor 147 on to the cathode of the Varactor 145. Capacitor 153, preferably 0.001 micro farad, and the resistor 151 creates a low pass filter to aid in removing any residual low frequency noise from the loop filter of a phase locked loop system (not specifically shown). Low loss capacitor 143, preferably a 5,6 pico farad, provides a high reactance to attenuate the large voltage swing at the resonator 137 from over driving the Varactor 145. The peak magnitude of the attenuated ac voltage across the diode should be controlled to stay below the magnitude of the DC bias expected for the lowest operating frequency of the oscillator. However, too great of an ac attenuation can isolate the capacitance change in the varactor and thus limit tuning range for a finite Vtune DC range. To accommodate all concerns it has been found that a varactor having relatively high initial C value, high Varactor gain, 2×fo<<SRF and ESR<<0.4 ohm operates satisfactorily. Such varactors are available from Toshiba as part number 1SV229.

Due to the relatively high operating impedances of the final oscillator it has been found that an electro magnetic shield 155 enclosing the oscillator helps to isolate the final oscillator from various potential interfering noise sources.

It will be appreciated by those of ordinary skill in the art that the apparatus disclosed provides a cost effective physically small relatively high performance oscillator that may be particularly advantageously employed as a voltage tuned oscillator for such applications as a phase locked loop frequency synthesizer.

This inventive oscillator may be readily and advantageously employed without otherwise sacrificing component count or size, or other economic considerations. Hence, the present invention, in furtherance of satisfying a long-felt and growing need in the field facilitates an oscillator having improved signal to side band noise performance for a given physical size along with other attributes known to be desirable in the oscillator art.

It will be apparent to those skilled in the art that the disclosed invention may be modified in numerous ways and may assume many embodiments other than the preferred form specifically set out and described above. For example while one particularly advantageous embodiment of the oscillator has been discussed others of different circuit topology clearly exist. Accordingly, it is intended by the appended claims to cover all modifications of the invention which fall within the true spirit and scope of the invention.

What is claimed is:

1. An oscillator arranged to operate at an oscillation frequency comprising in combination:

a resonant structure selected to resonate at a frequency, and an impedance, parallel coupled to said resonant structure, having a negative real part with a real magnitude and an imaginary part with an imaginary magnitude, said real magnitude being a function of said imaginary magnitude, said imaginary magnitude selected such that said real magnitude falls within 50% of a maximum at the oscillation frequency.

2. The oscillator of claim 1 wherein said resonant structure is operating in parallel resonance.

3. The oscillator of claim 2 wherein said resonant structure is a coaxial resonator with a shorted end.

4. The oscillator of claim 1 wherein said impedance is a transistor based common collector circuit.

5. The oscillator of claim 4 wherein said impedance is ac connected to said resonant structure.

6. An oscillator comprising in combination:

a resonant structure having a characteristic impedance, and an impedance including a transistor base terminal, said impedance AC connected to said resonant structure at said transistor base terminal and having an imaginary part with a magnitude, said magnitude selected to exceed said characteristic impedance at an operating frequency.

7. The oscillator of claim 6 wherein said resonant structure is operating in parallel resonance.

8. The oscillator of claim 7 wherein said resonant structure is a coaxial resonator with a shorted end.

9. The oscillator of claim 6 wherein said impedance is further ac coupled to a shorted end of said resonator by a capacitance.

10. The oscillator of claim 9 wherein said capacitance is varied to select said magnitude.

11. A voltage tuned oscillator arranged to operate at an oscillation frequency, comprising in combination;

a resonator open at a first end, shorted at a second end, and having a characteristic impedance;

a transistor having a base terminal, an emitter terminal, and a collector terminal, said base terminal ac connected to said first end of said resonator so as to load said resonator with an impedance having a first capacitive reactance, said emitter terminal series coupled through a second capacitive reactance to said second end of said resonator, said second capacitive reactance selected such that said first capacitive reactance exceeds said characteristic impedance at the operating frequency, said collector terminal coupled to a load; and a voltage variable reactance coupled to said first end of said coaxial resonator and further coupled to a tuning voltage.

12. The oscillator of claim 11 wherein said resonator is operating in parallel resonance.

13. The oscillator of claim 12 wherein said resonator is a coaxial resonator.

14. The oscillator of claim 11 wherein said second capacitance is selected such that a real part of said impedance falls within 50% of a maximum.

15. The oscillator of claim 14 wherein said tuning voltage is supplied by a phase locked loop.

* * * * *